United States Patent
Yang et al.

(10) Patent No.: US 9,673,040 B2
(45) Date of Patent: Jun. 6, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yu-Ru Yang, Hsinchu County (TW); Chia-Hsun Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/557,387

(22) Filed: Dec. 1, 2014

(65) Prior Publication Data

US 2016/0126139 A1  May 5, 2016

(30) Foreign Application Priority Data

Nov. 3, 2014  (TW) .............................. 103138083 A

(51) Int. Cl.
| | | |
|---|---|---|
| *H01L 21/70* | (2006.01) | |
| *H01L 21/3205* | (2006.01) | |
| *H01L 21/4763* | (2006.01) | |
| *H01L 21/02* | (2006.01) | |
| *H01L 29/49* | (2006.01) | |
| *H01L 21/28* | (2006.01) | |
| *H01L 21/8234* | (2006.01) | |
| *H01L 29/51* | (2006.01) | |

(52) U.S. Cl.
CPC .. *H01L 21/02186* (2013.01); *H01L 21/28088* (2013.01); *H01L 21/82345* (2013.01); *H01L 29/4966* (2013.01); *H01L 21/02244* (2013.01); *H01L 29/517* (2013.01)

(58) Field of Classification Search
CPC ......... H01L 21/82345; H01L 21/02068; H01L 21/02244; H01L 21/28088; H01L 29/4966; H01L 29/517; H01L 29/4958; H01L 21/823842; H01L 21/02186
USPC .................. 257/369, 407, E21.159; 438/592
See application file for complete search history.

(56) References Cited

U.S. PATENT DOCUMENTS

| | | | |
|---|---|---|---|
| 8,349,680 B2 | 1/2013 | Thei | |
| 2012/0256276 A1* | 10/2012 | Hwang | ........... H01L 21/823842 257/410 |
| 2013/0221441 A1* | 8/2013 | Jagannathan | ... H01L 21/823842 257/350 |
| 2013/0285158 A1* | 10/2013 | Kitano | ........... H01L 21/823842 257/407 |
| 2014/0061814 A1* | 3/2014 | Kim | ................ H01L 21/823857 257/369 |
| 2014/0367801 A1* | 12/2014 | Liu | ................... H01L 29/42376 257/407 |

OTHER PUBLICATIONS

Huang, Title of Invention: Metal Gate and Fabrication Method Thereof, U.S. Appl. No. 13/161,519, filed Jun. 16, 2011.

* cited by examiner

*Primary Examiner* — Fernando L Toledo
*Assistant Examiner* — Aaron Gray
(74) *Attorney, Agent, or Firm* — Winston Hsu

(57) ABSTRACT

A method for fabricating semiconductor device is disclosed. The method includes the steps of: providing a substrate having a high-k dielectric layer thereon; forming a first work function layer on the high-k dielectric layer; and forming a first oxygen-containing layer on the first work function layer.

11 Claims, 2 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming oxygen-containing layer on work function layer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (FinFET) has been developed to replace planar MOS transistors. Nevertheless, threshold voltages in current FinFET cannot be easily adjusted by using ion implantation. Hence, how to resolve this issue in today's FinFET architecture has become an important task in this field.

SUMMARY OF THE INVENTION

According to a preferred embodiment of the present invention, a method for fabricating semiconductor device is disclosed. The method includes the steps of: providing a substrate having a high-k dielectric layer thereon; forming a first work function layer on the high-k dielectric layer; and forming a first oxygen-containing layer on the first work function layer.

According to another aspect of the present invention, a semiconductor device is disclosed. The semiconductor device includes: a substrate; a high-k dielectric layer on the substrate; a first work function layer on the high-k dielectric layer; and a first oxygen-containing layer on the first work function layer.

According to another aspect of the present invention, a semiconductor device is disclosed. The semiconductor device includes: a substrate; a first gate structure on the substrate, wherein the first gate structure comprises a first high-k dielectric layer and a first work function layer on the first high-k dielectric layer; and a second gate structure on the substrate, in which the first gate structure comprises a second high-k dielectric layer and a second work function layer on the second high-k dielectric layer, in which the first work function layer and the second work function layer comprise different nitrogen to titanium ratio.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
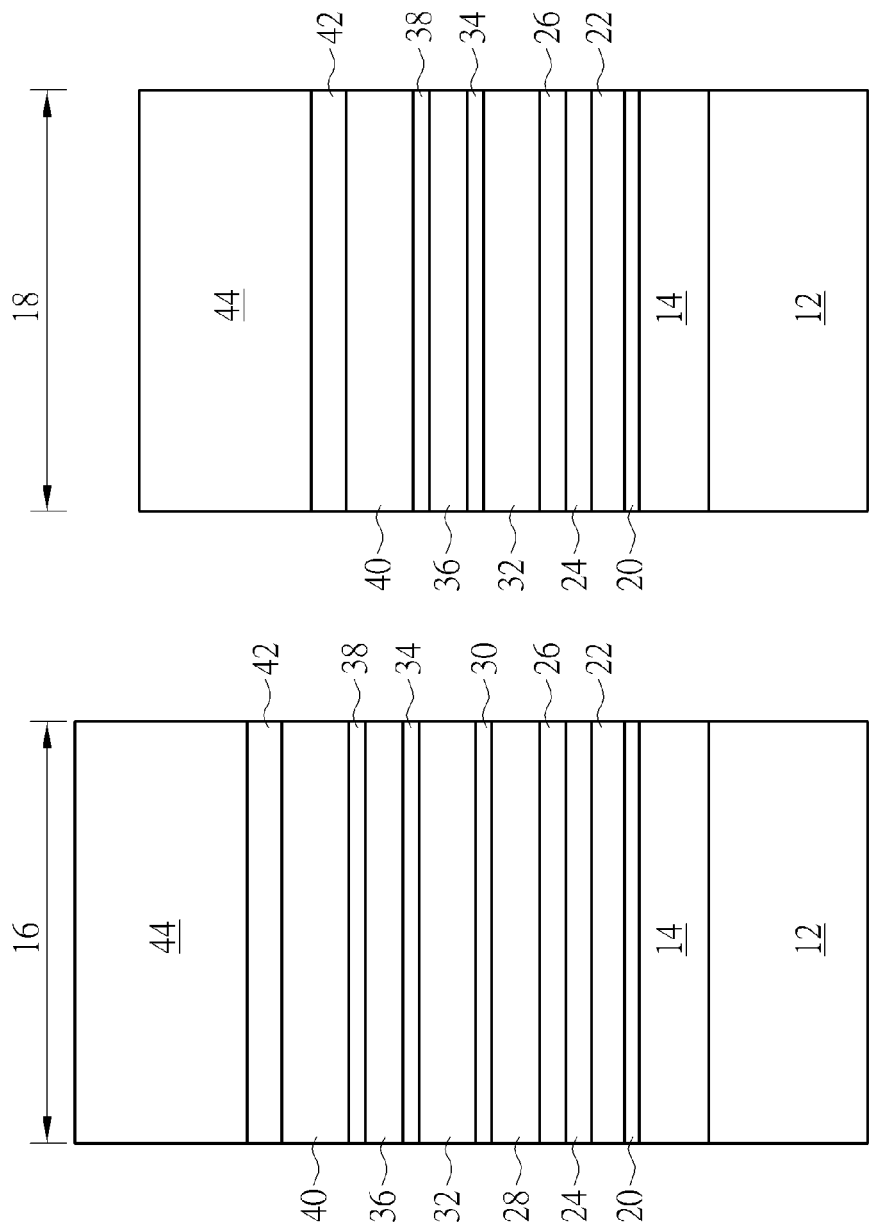
FIG. 1 illustrates a method for fabricating semiconductor device according to a preferred embodiment of the present invention.

Referring to FIG. 1, FIG. 1 illustrates a method for fabricating semiconductor device according to a preferred embodiment of the present invention. As shown in FIG. 1, a substrate 12, such as a silicon substrate or silicon-on-insulator (SOI) substrate is provided, and two transistor regions 16 and 18 are defined on the substrate 12. The transistor regions 16, 18 are preferably composed of same conductive type, such as PMOS regions or NMOS regions. Preferably, the transistor regions 16 and 18 of this embodiment are PMOS regions, and the transistor regions 16 and 18 are utilized for fabricating gate structures having different threshold voltages afterwards. At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI).

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

Next, an interfacial layer 20 is covered on the transistor regions 16 and 18 of the substrate 12, and a high-k dielectric layer 22 and two bottom barrier metal (BBM) layers 24 and 26 are deposited sequentially on the interfacial layer 20. It should be noted even though two BBM layers are disclosed in this embodiment, the quantity of the BBM layers is not limited to two, but could be a single layer or more than two layers depending on the product, which are all within the scope of the present invention.

In this embodiment, the interfacial layer 20 is preferably composed of nitrides, such as $SiO_2$, SiN, or SiON, or even high-k dielectric material. The BBM layer 24 is preferably composed of TiN and the BBM layer 26 is composed of TaN, but not limited thereto.

The high-k dielectric layer 22 is preferably selected from dielectric materials having dielectric constant (k value) larger than 4. For instance, the high-k dielectric layer 44 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

The formation of the high-k dielectric layer 22 could be accomplished by an atomic layer deposition (ALD) process or metal-organic chemical vapor deposition (MOCVD) process, but not limited thereto.

Next, a work function layer 28 is formed on the BBM layer 26 of the transistor regions 16 and 18, a patterned mask (not shown) such as a patterned resist is formed on the work function layer 28 of the transistor region 16, and then an etching process is conducted to remove the work function layer 28 on the transistor region 18. Another wet clean process is conducted thereafter by using cleaning agent such as diluted hydrofluoric acid (DHF) to remove the patterned resist while forming an oxygen-containing layer 30 on the work function layer 28 of the transistor region 16.

In this embodiment, the work function layer 28 could be utilized for tuning the work function of the metal gate so that the device could be adapted in an NMOS or a PMOS transistor. For an NMOS transistor, the work function layer 28 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function layer 28 having a work function ranging between 4.8 eV and 5.2 eV may include titanium nitride (TiN), tantalum nitride (TaN), tantalum carbide (TaC), but is not limited thereto.

It should be noted that since PMOS transistors are fabricated in this embodiment, the deposited work function layer 28 is preferably a p-type work function layer, and the oxygen-containing layer 30 formed during the stripping of patterned resist preferably composed of TiON and/or TiO$_2$.

It should also be noted that in addition to using wet clean process for stripping patterned resist and forming the oxygen-containing layer 30, the oxygen-containing layer 30 could also be formed by using dry ashing process during stripping of patterned resist, or could be formed after the patterned resist is stripped. Moreover, it would also be desirable to perform surface treatments such as a thermal oxidation process, oxygen plasma process, or oxygen implantation process after the deposition of work function layer 28 for forming the aforementioned oxygen-containing layer 30 on the surface of the entire work function layer 28, which is also within the scope of the present invention.

Next, the steps of forming the work function layer 28 and forming the oxygen-containing layer 30 could be repeated to form interchanging stack structures of work function layer and oxygen-containing layer on the transistor regions 16 and 18. For instance, another work function layer 32 could be formed on the oxygen-containing layer 30 of the transistor region 16 and the BBM layer 26 of the transistor region 18, in which the composition of the work function layer 32 could be the same as or different from the work function layer 28, but preferably have same conductive type as the work function layer 28, such as both being p-type.

Next, a thermal oxidation process is conducted on the work function layer 32 of transistor regions 16 and 18 for forming an oxygen-containing layer 34 on both regions 16 and 18. Next, the step of forming the work function layer 32 and oxygen-containing layer 34 is repeated one more time to form a work function layer 36 and oxygen-containing layer 38 on the oxygen-containing layer 34 of the transistor regions 16 and 18.

Next, another work function layer 40, such as an n-type work function layer could be formed on the oxygen-containing layer 38 along with metal gate fabrication process conducted in other NMOS regions (not shown), a top barrier metal (TBM) layer 42 composed of TiN could be formed on the work function layer 40, and a low resistance metal layer 44 composed of Cu, Al, W, TiAl, or CoWP could be formed on the TBM layer 42 for forming a metal gate on each transistor regions 16 and 18. This completes the fabrication of a semiconductor device according to a preferred embodiment of the present invention.

It should be noted that the metal gates of this embodiment on transistor regions 16 and 18 of same conductive type preferably includes at least one set of stack structure composed of interchanging work function layer and oxygen-containing layer, in which the quantity and thickness of the work function layer and/or the quantity and thickness of the oxygen-containing layer of the transistor regions 16 and 18 are preferably different and also that the oxygen-containing layer preferably composed of TiON or TiO$_2$.

Typically, threshold voltage is determined by parameters such as the quantity and thickness of the work function layer and/or quantity and thickness of the oxygen-containing layer, in which the work function layer having greater quantity of layers or greater thickness usually include greater work function value while the oxygen-containing layer having greater quantity of layers or greater thickness lowers the work function value of the work function layer. In this embodiment, the metal gate on transistor region 16 includes three sets of stack structures containing oxygen-containing layers 30, 34, 38 and work function layers 28, 32, 36, whereas the metal gate on transistor region 18 includes two sets of stack structures containing oxygen-containing layers 34, 38 and work function layers 32, 36. Since the work function layer on the transistor region 16 has comparable greater thickness, the metal gate on region 16 preferably has higher work function value thereby constituting a low threshold voltage (LVT) gate. The metal gate on the transistor region 18 on the other hand, includes lower work function value thereby constituting a standard threshold voltage (SVT) gate.

It should be further noted even though work function layer and oxygen-containing layer are stacked interchangeably in this embodiment, the quantity and location of the work function layer and oxygen-containing layer could also be adjusted according to the demand of the product. For instance, it would also be desirable to first form an oxygen-containing layer on a surface of the work function layer, and then depositing a plurality of work function layers on the oxygen-containing layer, which is also within the scope of the present invention.

Figure 2:
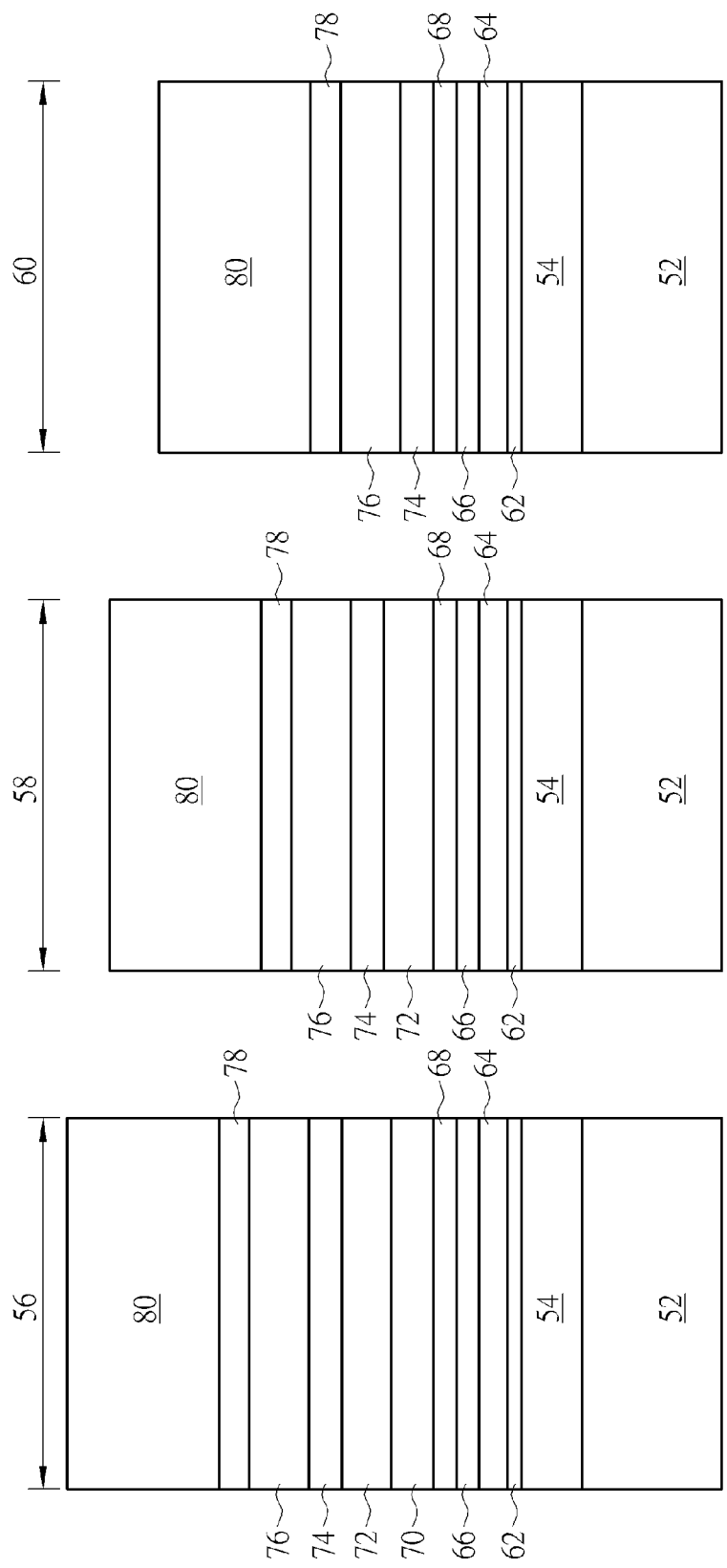
FIG. 2 illustrates a method for fabricating semiconductor device according to a preferred embodiment of the present invention.

Referring to FIG. 2, FIG. 2 illustrates a method for fabricating semiconductor device according to a preferred embodiment of the present invention. As shown in FIG. 2, a substrate 52, such as a silicon substrate or silicon-on-insulator (SOI) substrate is provided, and three transistor regions 56, 58, 60 are defined on the substrate 52. The transistor regions 56, 58, 60 are preferably composed of same conductive type, such as all being PMOS regions or NMOS regions. Preferably, the transistor regions 56, 58, 60 of this embodiment are PMOS regions, and the transistor regions 56, 58, 60 are utilized for fabricating gate structures having different threshold voltages afterwards. At least a first fin-shaped structure 54 and an insulating layer (not shown) are formed on the substrate 52, in which the bottom of the fin-shapes structure 54 is preferably enclosed by the insulating layer, such as silicon oxide to form a shallow trench isolation (STI).

Next, an interfacial layer 62 is covered on the transistor regions 56, 58, 60 of the substrate 52, and a high-k dielectric layer 64 and two bottom barrier metal (BBM) layers 66 and 68 are deposited sequentially on the interfacial layer 62. The composition of the interfacial layer 62, the high-k dielectric layer 64, and the BBM layers 66 and 68 could be the same as the ones disclosed in the aforementioned embodiment, and the details of which are not explained herein for the sake of brevity.

Next, a work function layer 70 is formed on the BBM layer 68 of the transistor regions 56, 58, 60, the work function layer 70 on the transistor regions 58 and 60 is removed, another work function layer 72 is formed on the work function layer 70 of the transistor region 56 and BBM layer 68 of the transistor regions 58 and 60, the work function layer 72 is removed from the transistor region 60, and another work function layer 74 is formed on the work function layer 72 of the transistor regions 56 and 58 and BBM layer 68 of the transistor region 60. This forms work function stack structures with different heights on each transistor regions 56, 58, 60 respectively. Next, another work function layer 76 of another conductive type, a top barrier metal layer 78, and a low resistance metal layer 80 could be formed sequentially on the work function layer 74 similar to the embodiment illustrated in FIG. 1 for forming metal gates. This completes the fabrication of a semiconductor device according to another embodiment of the present invention.

It should be noted that this embodiment preferably adjusts the amount of nitrogen gas injected during the deposition of work function layers 70, 72, 74 by physical vapor deposition (PVD) process, or adjusts the pulse time used during the formation of work function layers 70, 72, 74 by atomic layer deposition (ALD) process, so that the deposited work function layers 70, 72, 74 would include different nitrogen to titanium ratio. Preferably, the metal gates of same conductive type completed thereafter would not only include different quantity of work function layers, but also that each work function layer would include different nitrogen to titanium ratio so that metal gates of same conductive type having different threshold could be fabricated accordingly. Similar to the aforementioned embodiment, oxygen-containing layers (not shown) could be further formed on the surface of each work function layers 70, 72, 74 of transistor regions 56, 58, 60, the quantity of the oxygen-containing layers of each regions 56, 58, 60 could be less than or equal to the quantity of work function layers on each transistor regions 56, 58, 60, and quantity and thickness of the oxygen-containing layers on regions 56, 58, 60 could also be different.

In this embodiment for fabricating PMOS transistors, in increase in nitrogen ratio within the work function layers 70, 72, 74 represents an increase in the overall work function value and a decrease in threshold voltage, while an increase in titanium ratio within the work function layers 70, 72, 74 represents a decrease in overall work function value and an increase in threshold voltage.

As disclosed in FIG. 2, the metal gate on transistor region 56 preferably includes three work function layers 70, 72, 74, the metal gate on transistor region 58 includes two work function layers 72, 74, and the metal gate on transistor region 60 includes only one single work function layer 74. Since the three work function layers 70, 72, 74 not only have different nitrogen to titanium ratio but also have higher nitrogen ratio, the metal gate on transistor region 56 due to its higher work function value preferably constitute a low threshold voltage (LVT) gate, the metal gate on transistor region 58 due to its standard work function value constitute a standard threshold voltage (SVT) gate, and the metal gate on transistor region 60 due to its lower work function value constitute a high threshold voltage (HVT) gate.

Overall, the present invention preferably utilizes various approaches to adjust the work function values within work function layers so that each gate structure would have different threshold voltage. According to the aforementioned embodiments, treatments such as wet clean or thermal oxidation as disclosed in the embodiment shown in FIG. 1 could be used to form an oxygen-containing layer on work function layer surface for lowering the work function value of work function layer. Alternatively, nitrogen to titanium ratio within work function layer could also be adjusted directly during deposition stage as disclosed in the embodiment shown in FIG. 2 for fabricating metal gates with different threshold voltages.

It should be further noted that the fabrication of metal gates disclosed in the aforementioned embodiments shown in FIGS. 1-2 could all be applied to any stage of metal gate processes, including gate first process, high-k first approach from gate last process, and high-k last approach from gate last process. For instance, if a high-k first approach were to be utilized for fabricating metal gate of the present invention, the high-k dielectric layer preferably include an I-shaped cross-section whereas if a high-k last approach were to be utilized for fabricating metal gate of the present invention, the high-k dielectric layer would preferably include a U-shaped cross-section. As all variations of metal gate process are well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a high-k dielectric layer thereon, wherein the substrate comprises a first region and a second region;
   forming a first work function layer on the high-k dielectric layer on the first region and the second region;
   removing the first work function layer on the second region while forming a first oxygen-containing layer on the first work function layer on the first region;
   forming a second work function layer on the first region and the second region;
   forming a second oxygen-containing layer on the first region and the second region; and
   repeating the steps of forming the second work function layer and forming the second oxygen-containing layer on the first work function layer on the first region and the second region.

2. The method of claim 1, wherein the first work function layer comprises TiN.

3. The method of claim 1, further comprising performing a wet clean process or a thermal oxidation process for forming the first oxygen-containing layer.

4. The method of claim 3, further comprising utilizing diluted hydrofluoric acid (DHF) for conducting the wet clean process.

5. The method of claim 1, wherein the first oxygen-containing layer comprises TiON or $TiO_2$.

6. The method of claim 1, wherein each of the first work function layer and the second work function layer comprises a p-type work function layer.

7. The method of claim 1, wherein the first work function layer and the second work function layer comprises same conductive type.

8. A semiconductor device, comprising:
   a substrate having a first region and a second region;
   a high-k dielectric layer on the substrate on the first region and the second region;
   a number n of first work function layers on the high-k dielectric layer on the first region;
   a number n of first oxygen-containing layers stacked alternately on the n first work function layers;
   a number (n−1) of second work function layers on the high-k dielectric layer on the second region, wherein each of the first work function layers and each of the second work function layers have the same conductivity type; and
   a number (n−1) of second oxygen-containing layers stacked alternately on the (n−1) second work function layers, wherein n is greater than 2.

9. The semiconductor device of claim 8, wherein the first oxygen-containing layers comprise TiON or $TiO_2$.

10. The semiconductor device of claim 8, wherein each of the first work function layers and the second work function layer comprises a p-type work function layer.

11. The semiconductor device of claim 8, wherein the first work function layers and the second work function layer comprises same conductive type.

* * * * *